(12) United States Patent
Lee et al.

(10) Patent No.: US 11,226,562 B2
(45) Date of Patent: Jan. 18, 2022

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Yung-Yao Lee, Hsinchu County (TW); Yi-Ping Hsieh, Hsinchu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 318 days.

(21) Appl. No.: 16/196,439

(22) Filed: Nov. 20, 2018

(65) Prior Publication Data
US 2020/0096859 A1 Mar. 26, 2020

Related U.S. Application Data

(60) Provisional application No. 62/734,037, filed on Sep. 20, 2018.

(51) Int. Cl.
| | |
|---|---|
| *G03F 7/20* | (2006.01) |
| *G03F 1/76* | (2012.01) |
| *H01L 21/027* | (2006.01) |
| *G03F 1/22* | (2012.01) |
| *G03F 1/60* | (2012.01) |

(52) U.S. Cl.
CPC .............. *G03F 7/2002* (2013.01); *G03F 1/22* (2013.01); *G03F 1/60* (2013.01); *G03F 1/76* (2013.01); *G03F 7/2004* (2013.01); *G03F 7/2006* (2013.01); *G03F 7/2024* (2013.01); *H01L 21/0274* (2013.01)

(58) Field of Classification Search
None
See application file for complete search history.

(56) References Cited

U.S. PATENT DOCUMENTS

| | | | |
|---|---|---|---|
| 8,796,666 | B1 | 8/2014 | Huang et al. |
| 9,012,132 | B2 | 4/2015 | Chang |
| 9,093,530 | B2 | 4/2015 | Huang et al. |
| 9,028,915 | B2 | 5/2015 | Chang et al. |
| 9,146,469 | B2 | 9/2015 | Liu et al. |
| 9,213,234 | B2 | 12/2015 | Chang |
| 9,223,220 | B2 | 12/2015 | Chang |

(Continued)

*Primary Examiner* — Kathleen Duda
(74) *Attorney, Agent, or Firm* — WPAT, P.C., Intellectual Property Attorneys; Anthony King

(57) ABSTRACT

A method of manufacturing a semiconductor structure includes providing a mask including a first substrate; a first mask layer disposed over the first substrate, including a plurality of first recesses extended through the first mask layer; a second mask layer disposed over the first mask layer and including a plurality of second recesses extended through the second mask layer; providing a second substrate including a photoresist disposed over the second substrate; and projecting a predetermined electromagnetic radiation through the mask towards the photoresist, wherein the first mask layer is at least partially transparent to the predetermined electromagnetic radiation, the second mask layer is opaque to the predetermined electromagnetic radiation, and at least a portion of the second mask layer is disposed between two of the plurality of second recesses.

15 Claims, 17 Drawing Sheets

(56) References Cited

U.S. PATENT DOCUMENTS

| | | |
|---|---|---|
| 9,256,133 B2 | 2/2016 | Chang |
| 9,536,759 B2 | 1/2017 | Yang et al. |
| 9,548,303 B2 | 1/2017 | Lee et al. |
| 2011/0123912 A1* | 5/2011 | Tanabe ................ G03F 1/72 430/5 |
| 2012/0107731 A1* | 5/2012 | Tseng ................ G03F 1/50 430/5 |
| 2013/0101926 A1* | 4/2013 | Jang ................ G03F 1/26 430/5 |

\* cited by examiner

SEMICONDUCTOR STRUCTURE AND MANUFACTURING METHOD THEREOF

PRIORITY CLAIM AND CROSS-REFERENCE

This application claims the benefit of a provisional application Ser. 62/734,037 filed on Sep. 20, 2018, entitled "SEMICONDUCTOR STRUCTURE AND MANUFACTURING METHOD THEREOF," the disclosure of which is hereby incorporated by reference in its entirety.

BACKGROUND

Electronic equipments using semiconductor devices are essential for many modern applications. With the advancement of electronic technology, the semiconductor device is becoming increasingly smaller in size and having greater functionality and greater amounts of integrated circuitry. The manufacturing operations of the semiconductor device involve many steps and operations on such a small and thin semiconductor device.

During the manufacturing of the semiconductor device, a wafer is provided and several circuitry patterns are formed over the wafer by photolithography operations. Upon the photolithography operations, an electromagnetic radiation is irradiated on the wafer through a mask to pattern a photoresist disposed over the wafer. However, some of electromagnetic energy is absorbed by the mask. Heat is generated and cause thermal distortion of the mask. Such distortion may lead to misalignment between the mask and the wafer.

As such, there is a continuous need to modify and improve the manufacturing operations of the semiconductor device.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
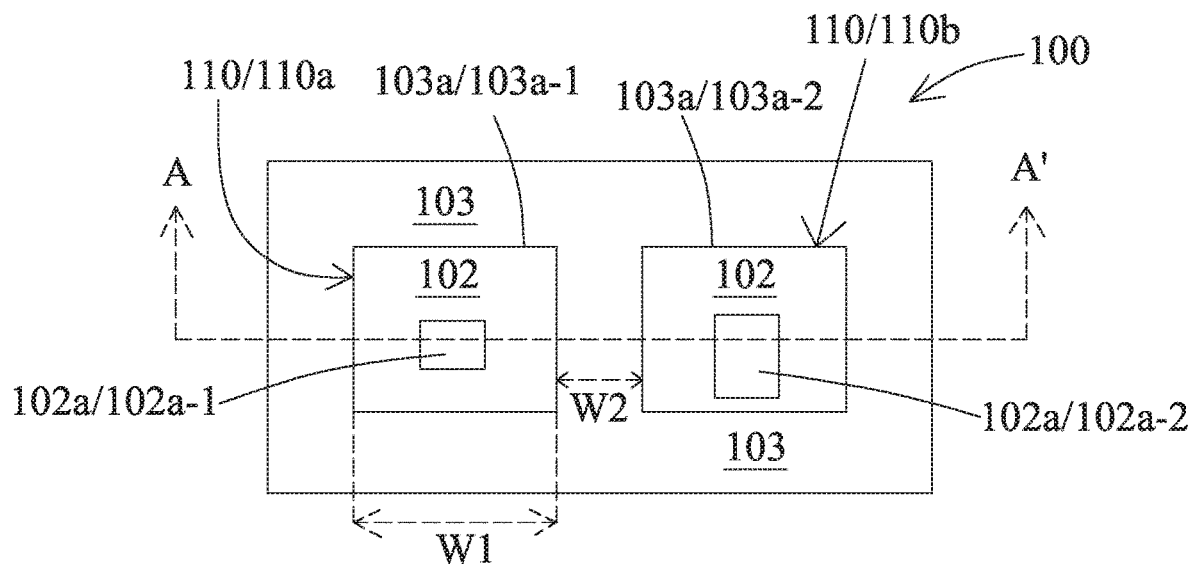
FIG. 1 is a schematic top plan view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

In a semiconductor wafer, the circuitry patterns and the electrical components are formed by photolithography and etching operations. An electromagnetic radiation such as ultraviolet or laser is irradiated onto a photoresist over the wafer through a photomask, such that images of circuitry patterns and electrical components on the photomask are transferred to and patterned over the photoresist. The patterned photoresist becomes an etch mask. The wafer exposed from the patterned photoresist is etched to form the circuitry patterns and electrical components.

The photomask can be a multi-layer mask (MLM) defined with several regions for patterning more than one layer of the wafer. Each region of a MLM is used to form a different layer on the wafer. By forming multiple regions for different layers on the same mask, the mask production cost is reduced. Upon photolithography operations, the photomask may absorb some energy of the electromagnetic radiation irradiated onto the photomask and thus generate heat. Since different regions of the photomask involve different materials with different thermal properties (e.g. different coefficient of thermal expansion (CTE), etc.), the photomask may deform and images of circuitry patterns or electrical components over some regions of the photomask are distorted. For example, a material absorbing the electromagnetic radiation is present at an edge region of the photomask, while such material is absent from a central region of the photomask. As such, circuitry patterns or electrical components projected from different regions of the photomask to the wafer may be misaligned, and ultimately results in poor electrical connection between circuitries or electrical components formed over the wafer.

In the present disclosure, a semiconductor structure is disclosed. The semiconductor structure is a photomask, which includes a substrate, a first mask layer disposed over the substrate and including a plurality of first recesses extended through the first mask layer, and a second mask layer disposed over the first mask layer and including a plurality of second recesses extended through the second mask layer. The first mask layer is at least partially transparent to a predetermined electromagnetic radiation, and the second mask layer is opaque to the predetermined electromagnetic radiation. At least a portion of the second mask layer is disposed between two of the plurality of second recesses. As such, each region defined over the semiconductor structure is surrounded by the second mask layer, and thermal stress around each region upon photolithography operations is substantially consistent. Therefore, alignment between regions of the semiconductor structure is improved, and quality of formation of circuit feature over a semiconductive substrate or wafer by the semiconductor structure is also improved.

Figure 2:
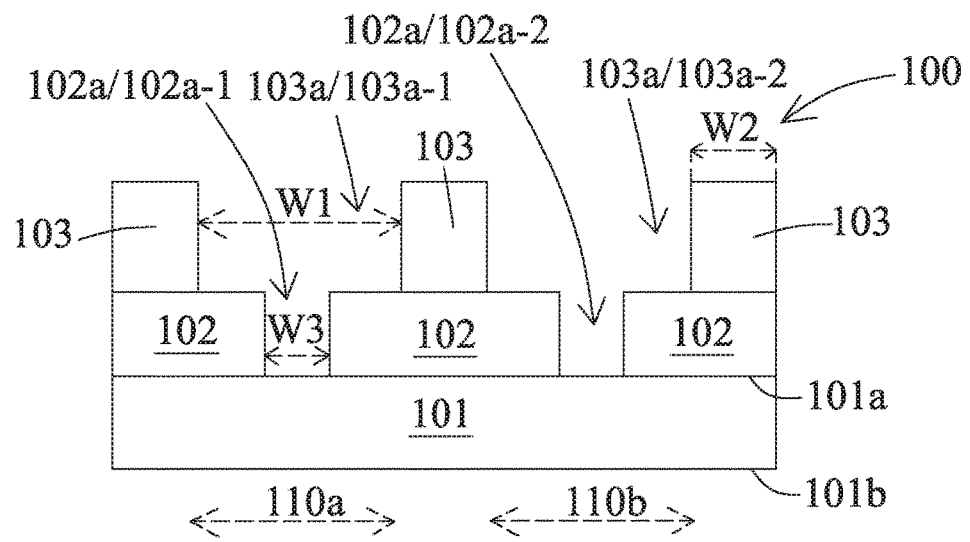
FIG. 2 is a schematic cross sectional view of the semiconductor structure along AA' of FIG. 1.

FIG. 1 is a schematic top view of a semiconductor structure 100 in accordance with various embodiments of the present disclosure, and FIG. 2 is a schematic cross sectional view of the semiconductor structure 100 along AA' in FIG. 1. In some embodiments, the semiconductor structure 100 includes a substrate 101, a first mask layer 102 and a second mask layer 103. The semiconductor structure 100 is a mask or a photomask for photolithography operations. In some embodiments, the semiconductor structure 100 is a phase shift mask (PSM). In some embodiments, the semiconductor structure 100 is an attenuated phase shift mask. The semiconductor structure 100 includes an image of a circuit feature such as a circuitry pattern, an electrical component, etc., and is configured to project the image of the circuit feature to a semiconductive wafer or a semiconductive substrate upon photolithography operations. The semiconductor structure 100 is defined with several regions 110. Each region 110 includes an image of circuit features for different layers of a wafer and is configured to form circuit features over different layers of a wafer.

The substrate 101 is transparent to a predetermined electromagnetic radiation. The substrate 101 allows the predetermined electromagnetic radiation passing through. In some embodiments, the substrate 101 includes a front side 101a and a back side 101b opposite to the front side 101a. In some embodiments, the predetermined electromagnetic radiation can transmit from the front side 101a to the back side 101b or from the back side 101b to the front side 101a. In some embodiments, the substrate 101 is quartz, fused quartz, glass or other suitable materials. In some embodiments, the predetermined electromagnetic radiation is ultraviolet (UV), laser, visible light, x-ray, extreme ultraviolet (EUV), deep ultraviolet (DUV), ions beam, electrons beam, etc. In some embodiments, the predetermined electromagnetic radiation has a wavelength of 365 nm, 248 nm or 193 nm. The substrate 101 has a top cross section (a cross section from the top view of the semiconductor structure 100 as shown in FIG. 1) in a circular, quadrilateral, rectangular, square or other suitable shapes.

The first mask layer 102 is disposed over the substrate 101. In some embodiments, the first mask layer 102 is disposed over the front side 101a of the substrate 101. The first mask layer 102 is at least partially transparent to the predetermined electromagnetic radiation. In some embodiments, the predetermined electromagnetic radiation is ultraviolet (UV), laser, visible light, x-ray, extreme ultraviolet (EUV), deep ultraviolet (DUV), ions beam, electrons beam, etc. In some embodiments, about 5% to about 20% of the predetermined electromagnetic radiation is penetrable to the first mask layer 102. In some embodiments, about 6% to about 15% of the predetermined electromagnetic radiation is penetrable to the first mask layer 102. In some embodiments, the first mask layer 102 includes molybdenum silicon (MoSi).

A phase of the predetermined electromagnetic radiation passing through the first mask layer 102 is shifted 180° with respect to a phase of the predetermined electromagnetic radiation passing through the substrate 101 upon projection of the predetermined electromagnetic radiation through the first mask layer 102 and the substrate 101. In some embodiments, the first mask layer 102 has a thickness such that a certain amount of the predetermined electromagnetic radiation can pass through the first mask layer 102 or a certain amount of the predetermined electromagnetic radiation is blocked by the first mask layer 102. In some embodiments, the first mask layer 102 has the thickness such that the phase of the predetermined electromagnetic radiation passing through the first mask layer 102 is shifted 180° with respect to the phase of the predetermined electromagnetic radiation passing through the substrate 101 upon projection of the predetermined electromagnetic radiation through the first mask layer 102 and the substrate 101.

The first mask layer 102 includes several first recesses 102a extended through the first mask layer 102. A portion of the front side 101a of the substrate 101 is exposed from the first recess 102a. In some embodiments, the predetermined electromagnetic radiation can pass through the first recesses 102a. The first recesses 102a can be projected over a semiconductive substrate or wafer by the predetermined electromagnetic radiation. Each of the first recesses 102a is an image of a circuit feature. In some embodiments, the first recess 102a is an image of a trace, a via, a contact, a plug, a trench, etc. In some embodiments, the first recess 102a is extended to the substrate 101. The first recess 102a has a top cross section (a cross section from the top view of the semiconductor structure 100 as shown in FIG. 1) in a quadrilateral, rectangular, polygonal or other suitable shapes. In some embodiments, the first recesses 102a-1 and 102a-2 are substantially different from each other. In some embodiments, the first recesses 102a-1 and 102a-2 are different circuit features. In some embodiments, the first recesses 102a-1 and 102a-2 are configured to form the circuit features over different layers of the semiconductive substrate or wafer. The semiconductor structure 100 includes several regions 110. In some embodiments, the semiconductor structure 100 includes two different regions 110a and 110b. Each region 110 includes the first recesses 102a of various shapes and sizes. Only one first recess 102a is shown for each region 110 in the Figures for simplicity of description.

The second mask layer 103 is disposed over the first mask layer 102. In some embodiments, the second mask layer 103 is in contact with the first mask layer 102. The second mask layer 103 is opaque to the predetermined electromagnetic radiation. In some embodiments, the predetermined electromagnetic radiation is ultraviolet (UV), laser, visible light, x-ray, extreme ultraviolet (EUV), deep ultraviolet (DUV), ions beam, electrons beam, etc. In some embodiments, about 100% of the predetermined electromagnetic radiation is absorbed or blocked by the second mask layer 103. In some embodiments, the second mask layer 103 includes chromium (Cr).

In some embodiments, the second mask layer 103 is a boundary layer surrounding several regions 110. The second mask layer 103 includes several second recesses 103a extended through the second mask layer 103. In some embodiments, the second recesses 103a are disposed over the first recesses 102a correspondingly. In A portion of the front side 101a of the substrate 101 is exposed from the second recesses 103a. Each region 110 includes the second recess 103a. In some embodiments, the predetermined electromagnetic radiation can pass through the second recesses 103a. In some embodiments, the first recess 102a is coupled with the second recess 103a. In some embodiments, at least a portion of the first mask layer 102 is exposed from the second recess 103a. The second recess 103a has a top cross section (a cross section from the top view of the semiconductor structure 100 as shown in FIG. 1) in a quadrilateral, rectangular, polygonal or other suitable shapes.

A width W1 of the second recess 103a is substantially greater than a width W3 of the first recess 102a. In some embodiments, the width W1 of the second recesses 103a are substantially same as each other. In some embodiments, shapes of the second recesses 103a are substantially same as each other. In some embodiments, the width W1 of the second recess 103a is about 5 mm to about 15 mm. In some embodiments, the width W1 of the second recess 103a is about 8 mm to about 10 mm.

At least a portion of the second mask layer 103 is disposed between two of second recesses 103a. For example, a portion of the second mask layer 103 is disposed between the second recesses 103a-1 and 103a-2. Each of the second recesses 103a is surrounded or enclosed by the second mask layer 103. In some embodiments, at least a portion of the first mask layer 102 is disposed between two of the first recesses 102a, and the portion of the second mask layer 103 is disposed over the portion of the first mask layer 102. In some embodiments, the portion of the second mask layer 103 disposed between the second recesses 103a-1 and 103a-2 is disposed over the portion of the first mask layer 102 disposed between the first recesses 102a-1 and 102a-2.

In some embodiments, a ratio of a width W2 of the portion of the second mask layer to the width W1 of the second recess 103a is substantially greater than or equal to 0.001. In some embodiments, the width W2 of the second mask layer 103 surrounding each second recess 103a is substantially consistent. In some embodiments, the width W2 of the second mask layer 103 is about 50 um to about 70 um. In some embodiments, the width W2 of the second mask layer 103 is about 60 um.

Figure 3:
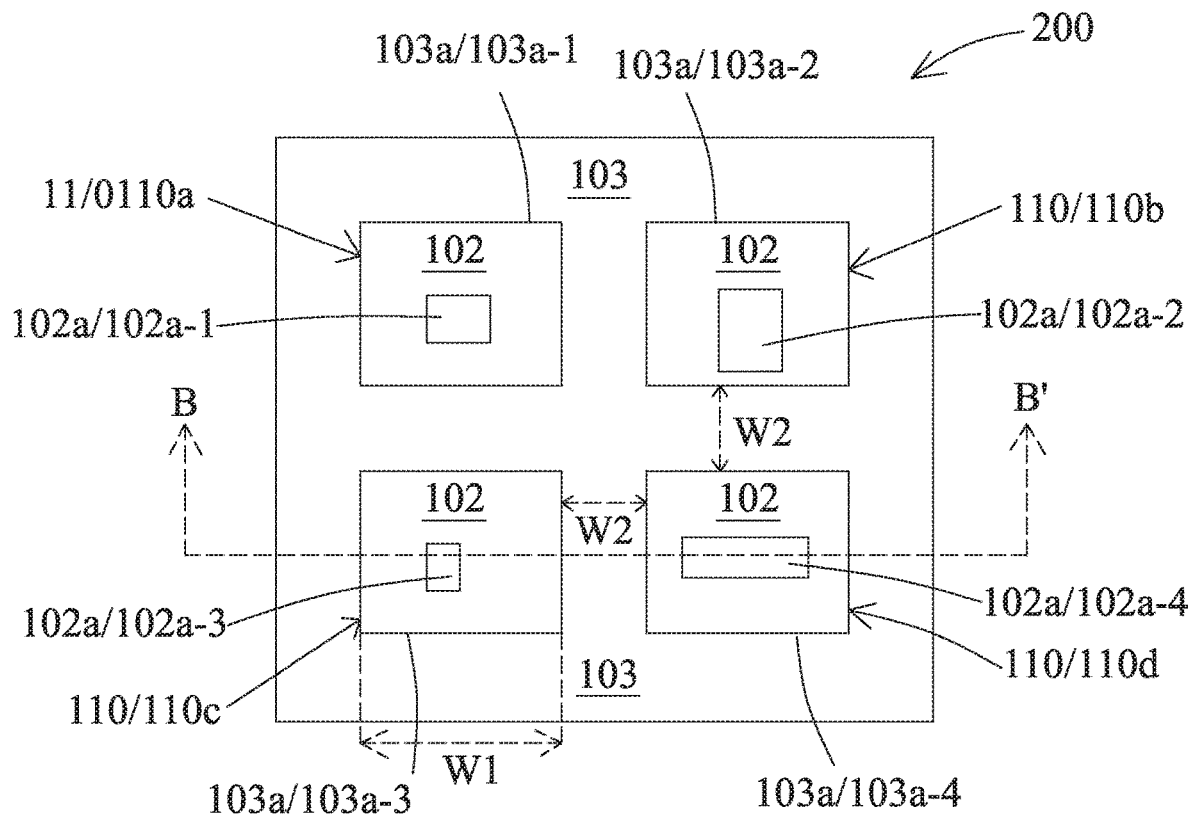
FIG. 3 is a schematic top plan view of a semiconductor structure in accordance with some embodiments of the present disclosure.
Figure 4:
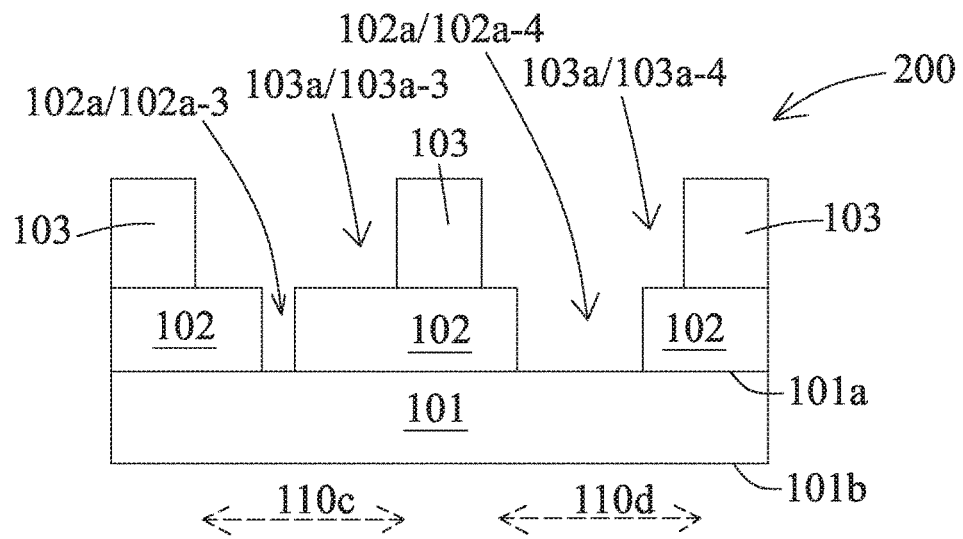
FIG. 4 is a schematic cross sectional view of the semiconductor structure along BB' of FIG. 3.

FIG. 3 is a schematic top view of a semiconductor structure 200 in accordance with various embodiments of the present disclosure, and FIG. 4 is a schematic cross sectional view of the semiconductor structure 200 along BB' in FIG. 3. The semiconductor structure 200 is a photomask, which includes a substrate 101, a first mask layer 102 and a second mask layer 103, which have similar configurations as described above or illustrated in FIG. 1 or 2.

The semiconductor structure 200 is defined with several regions 110. In some embodiments, the semiconductor structure 200 is defined with four regions 110a, 110b, 110c and 110d. Each region 110 includes the first recesses 102a of various shapes and sizes. Only one first recess 102a is shown for each region 110 in the Figures for simplicity of description. In some embodiments, the first mask layer 102 includes four first recesses 102a-1, 102a-2, 102a-3 and 102a-4, and the second mask layer 103 includes four second recesses 103a-1, 103a-2, 103a-3 and 103a-4. Each of the first recesses 102a-1, 102a-2, 102a-3 and 102a-4 is an image of a circuit feature. In some embodiments, the first recesses 102a-1, 102a-2, 102a-3 and 102a-4 are substantially different from each other. For example, the first recesses 102a-1, 102a-2, 102a-3 and 102a-4 are four different circuit features. In some embodiments, the first recesses 102a-1, 102a-2, 102a-3 and 102a-4 can be projected over a semiconductive substrate or wafer by the predetermined electromagnetic radiation. In some embodiments, the first recesses 102a-1, 102a-2, 102a-3 and 102a-4 are configured to form the circuit features over different layers of a semiconductive substrate or wafer.

In some embodiments, each of the second recesses 103a-1, 103a-2, 103a-3 and 103a-4 surrounds the corresponding first recesses 102a-1, 102a-2, 102a-3 and 102a-4. In some embodiments, each region 110 is surrounded or enclosed by the second mask layer 103.

Figure 5:
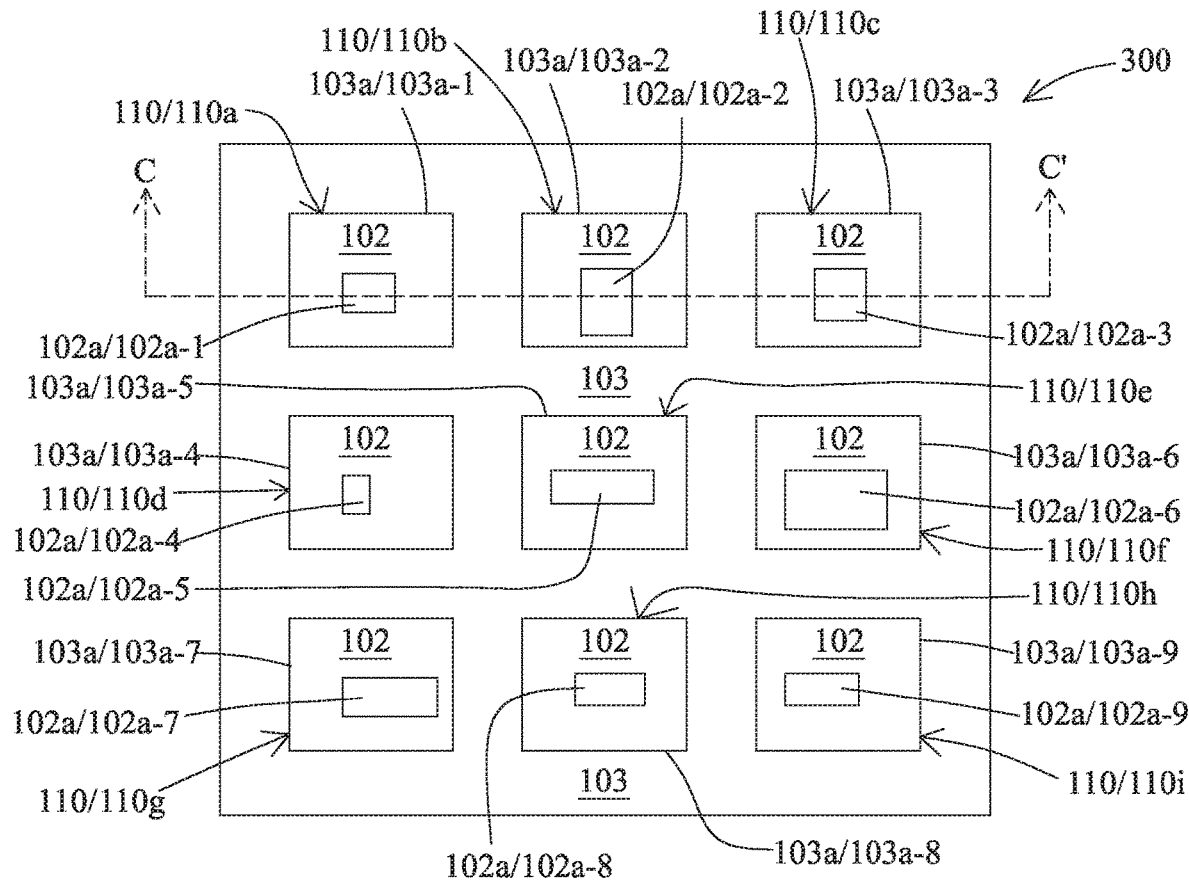
FIG. 5 is a schematic top plan view of a semiconductor structure in accordance with some embodiments of the present disclosure.
Figure 6:
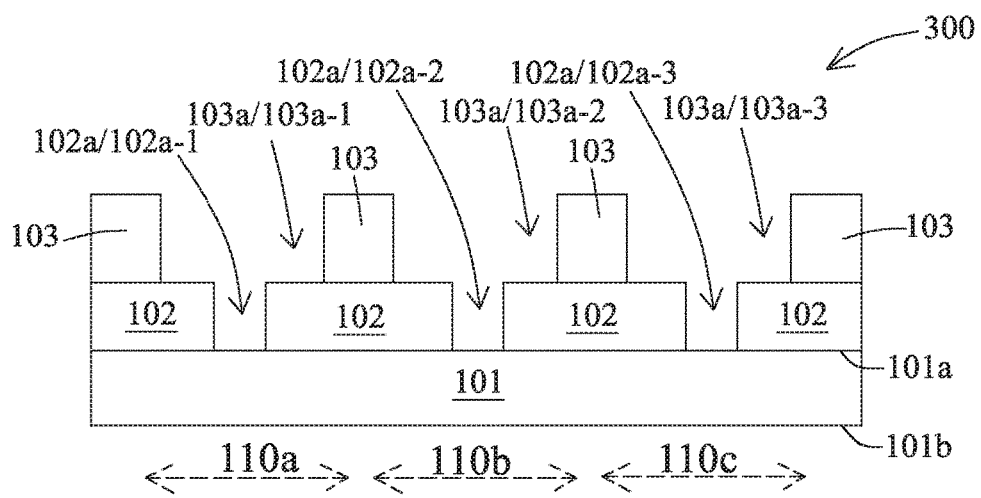
FIG. 6 is a schematic cross sectional view of the semiconductor structure along CC' of FIG. 5.

FIG. 5 is a schematic top view of a semiconductor structure 300 in accordance with various embodiments of the present disclosure, and FIG. 6 is a schematic cross sectional view of the semiconductor structure 300 along CC' in FIG. 5. In some embodiments, the semiconductor structure 300 is a photomask which includes a substrate 101, a first mask layer 102 and a second mask layer 103, which have similar configurations as described above or illustrated in FIG. 1 or 2.

The semiconductor structure 300 is defined with several regions 110. In some embodiments, the semiconductor structure 300 is defined with nine regions 110a, 110b, 110c, 110d, 110e, 110f, 110g, 110h and 110i. Each region 110 includes the first recesses 102a of various shapes and sizes. Only one first recess 102a is shown for each region 110 in the Figures for simplicity of description. In some embodiments, the first mask layer 102 includes nine first recesses 102a-1, 102a-2, 102a-3, 102a-4, 102a-5, 102a-6, 102a-7, 102a-8 and 102a-9, and the second mask layer 103 includes nine second recesses 103a-1, 103a-2, 103a-3, 103a-4, 103a-5, 103a-6, 103a-7, 103a-8 and 103a-9. In some embodiments, each of the first recesses 102a-1, 102a-2, 102a-3, 102a-4, 102a-5, 102a-6, 102a-7, 102a-8 and 102a-9 is an image of a circuit feature. In some embodiments, the first recesses 102a-1, 102a-2, 102a-3, 102a-4, 102a-5, 102a-6, 102a-7, 102a-8, 102a-9 are substantially different from each other. For example, the first recesses 102a-1, 102a-2, 102a-3, 102a-4, 102a-5, 102a-6, 102a-7, 102a-8 and 102a-9 are nine different circuit features. The first recesses 102a-1, 102a-2, 102a-3, 102a-4, 102a-5, 102a-6, 102a-7, 102a-8 and 102a-9 are configured to form the circuitry pattern, the electrical component or the circuit feature over different layers of a semiconductive substrate or wafer.

Each of the second recesses 103a-1, 103a-2, 103a-3, 103a-4, 103a-5, 103a-6, 103a-7, 103a-8 and 103a-9 includes an image of a circuit feature. In The second recesses 103a-1, 103a-2, 103a-3, 103a-4, 103a-5, 103a-6, 103a-7, 103a-8 and 103a-9 are configured to form images of circuit features over different layers of a semiconductive substrate or wafer. For example, the second recesses 103a-1, 103a-2, 103a-3, 103a-4, 103a-5, 103a-6, 103a-7, 103a-8 and 103a-9 are configured to form images of circuit features over nine different layers of a semiconductive substrate or wafer.

In some embodiments, each of the second recesses 103a-1, 103a-2, 103a-3, 103a-4, 103a-5, 103a-6, 103a-7, 103a-8 and 103a-9 surrounds the corresponding first recesses 102a-1, 102a-2, 102a-3, 102a-4, 102a-5, 102a-6, 102a-7, 102a-8, 102a-9. In some embodiments, each region 110 is surrounded or enclosed by the second mask layer 103.

Figure 7:
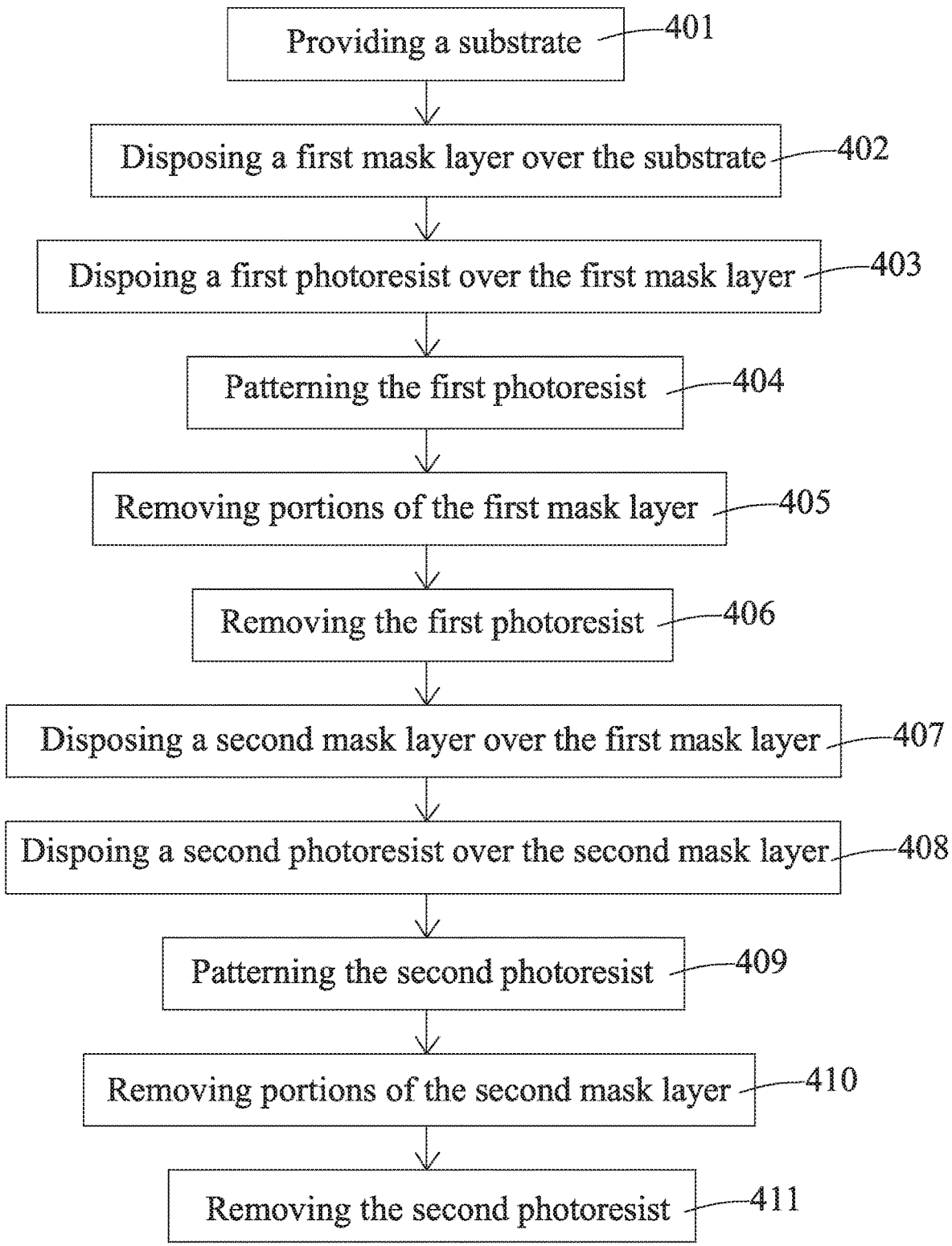
FIG. 7 is a flow diagram of a method of manufacturing a semiconductor structure in accordance with some embodiments of the present disclosure.

In the present disclosure, a method of manufacturing a semiconductor structure 100, 200 or 300 is also disclosed. In some embodiments, a semiconductor structure 100, 200 or 300 is formed by a method 400. The method 400 includes a number of operations and the description and illustration are not deemed as a limitation as the sequence of the operations. FIG. 7 is an embodiment of the method 400 of manufacturing the semiconductor structure 100, 200 or 300. The method 400 includes a number of operations (401, 402, 403, 404, 405, 406, 407, 408, 409, 410 and 411).

Figure 7A:
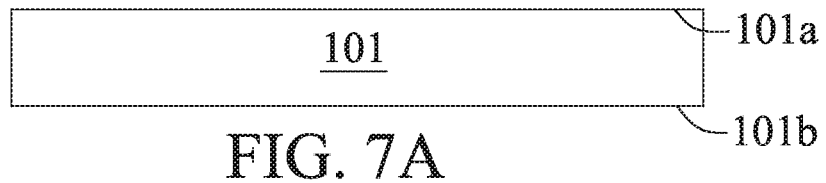
FIGS. 7A-7L are schematic views of manufacturing a semiconductor structure by a method of FIG. 7 in accordance with some embodiments of the present disclosure.

In operation 401, a substrate 101 is provided or received as shown in FIG. 7A. In The substrate 101 is transparent to a predetermined electromagnetic radiation. In some embodiments, the substrate 101 includes a front side 101a and a back side 101b opposite to the front side 101a. In some embodiments, the predetermined electromagnetic radiation can transmit from the front side 101a to the back side 101b or from the back side 101b to the front side 101a. In some embodiments, the substrate 101 includes quartz, fused quartz, glass or other suitable materials. In some embodiments, the predetermined electromagnetic radiation is ultraviolet (UV), laser, visible light, x-ray, extreme ultraviolet (EUV), deep ultraviolet (DUV), ions beam, electrons beam, etc. In some embodiments, the substrate 101 has similar configuration as described above or illustrated in FIGS. 1-6.

Figure 7B:
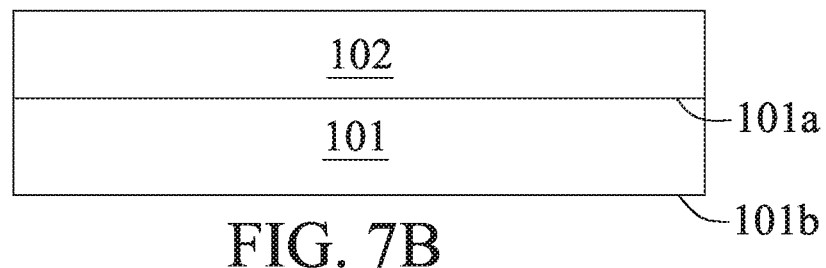

In operation 402, a first mask layer 102 is disposed over the substrate 101 as shown in FIG. 7B. The first mask layer 102 is disposed over the front side 101a of the substrate 101. The first mask layer 102 is at least partially transparent to the predetermined electromagnetic radiation. In some embodiments, the first mask layer 102 includes molybdenum silicon (MoSi). In some embodiments, the first mask layer 102 is disposed by spin coating, sputtering, chemical vapor deposition (CVD) or any other suitable operations. In some embodiments, the first mask layer 102 has similar configuration as described above or illustrated in FIGS. 1-6.

Figure 7C:
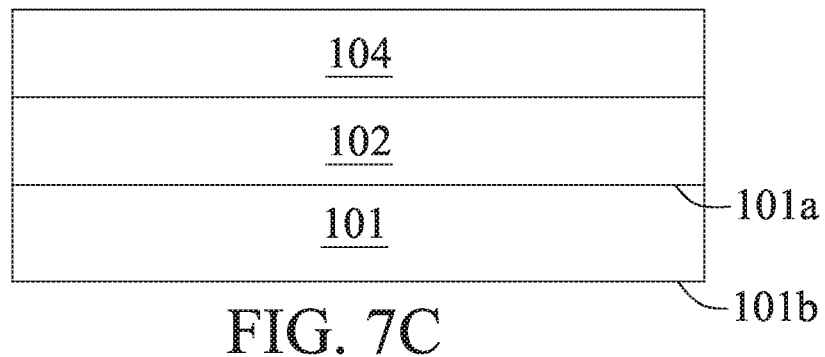

In operation 403, a first photoresist 104 is disposed over the first mask layer 102 as shown in FIG. 7C. In The first photoresist 104 is coated on the first mask layer 102. The first photoresist 104 is a light sensitive material with chemical properties depending on an exposure of an electromagnetic radiation. In some embodiments, the first photoresist 104 is sensitive to an electromagnetic radiation such as an ultra violet (UV), that the chemical properties of the first photoresist 104 are changed upon exposure to the electromagnetic radiation. In some embodiments, the first photoresist 104 is disposed over the first mask layer 102 by spin coating or any other suitable operations.

Figure 7D:
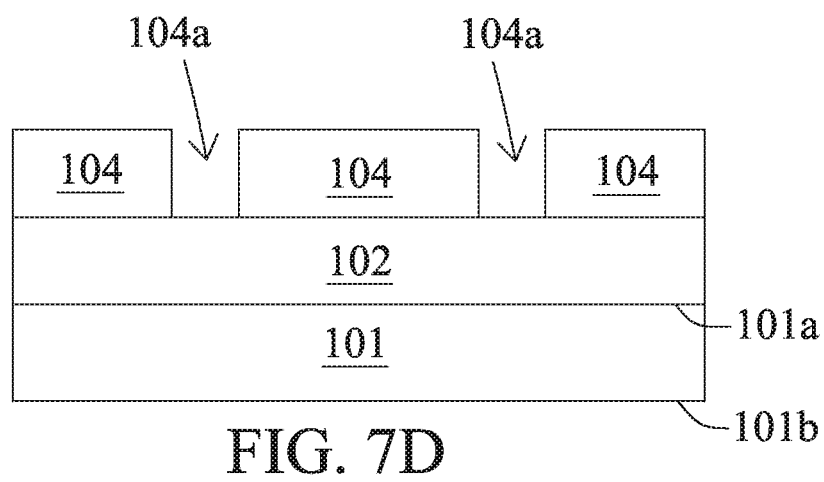

In operation 404, the first photoresist 104 is patterned to form several first openings 104a as shown in FIG. 7D. The first photoresist 104 is patterned by removing portions of the first photoresist 104. In some embodiments, some portions of the first photoresist 104 are exposed to the electromagnetic radiation, and those exposed portions are dissolvable by a developer solution while those unexposed portions are not dissolvable by the developer solution. The first photoresist 104 is patterned after removal of the exposed portions of the first photoresist 104. In some embodiments, the first openings 104a are formed after removal of the exposed portions of the first photoresist 104. In some embodiments, some portions of the first mask layer 102 are exposed from the first photoresist 104 by the first openings 104a.

Figure 7E:
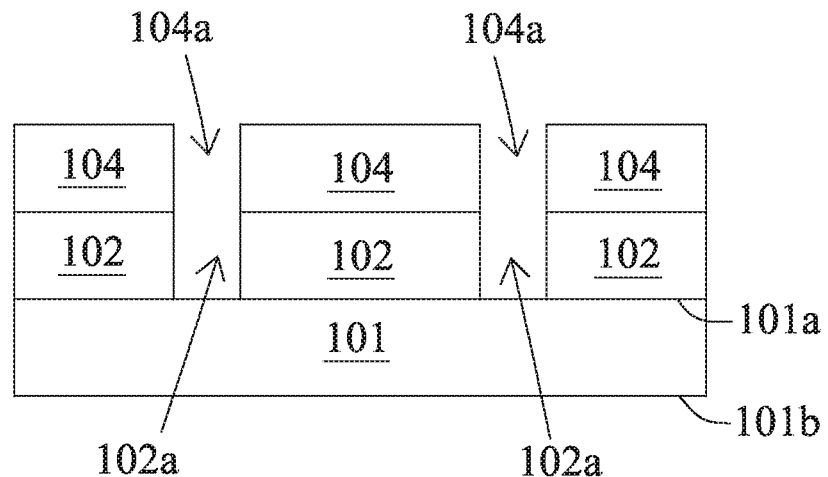

In operation 405, portions of the first mask layer 102 exposed from the first photoresist 104 are removed to form several first recesses 102a as shown in FIG. 7E. The first openings 104a correspond to the first recesses 102a respectively. In some embodiments, the first recesses 102a are extended through the first mask layer 102. In some embodiments, the portions of the first mask layer 102 exposed from the first photoresist 104 are removed by suitable etching operation such as plasma etching, an anisotropic dry etching, a reactive ion etching (RIE), a dry etching or etc.

Figure 7F:
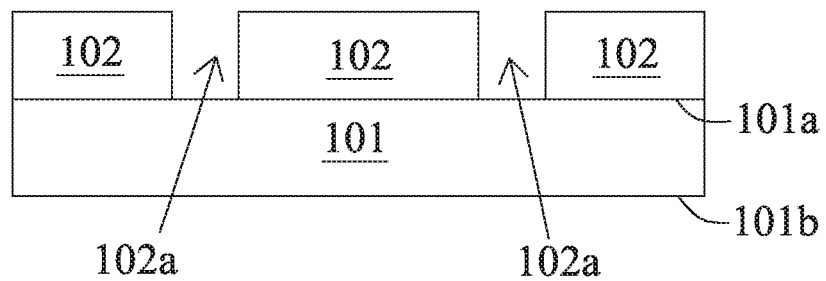

In operation 406, the first photoresist 104 is removed as shown in FIG. 7F. In some embodiment, the first photoresist 104 is removed by suitable photoresist stripping technique, such as chemical solvent cleaning, plasma ashing, dry stripping and/or the like.

Figure 7G:
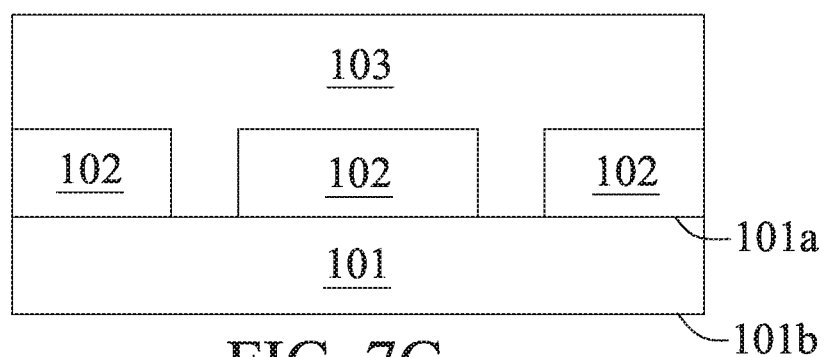

In operation 407, a second mask layer 103 is disposed over the first mask layer 102 as shown in FIG. 7G. The second mask layer 103 is opaque to the predetermined electromagnetic radiation. In some embodiments, the second mask layer 103 includes chromium (Cr). In some embodiments, the second mask layer 103 is disposed by spin coating, sputtering, chemical vapor deposition (CVD), physical vapor deposition (PVD) or any other suitable operations. In some embodiments, the second mask layer 103 has similar configuration as described above or illustrated in FIGS. 1-6.

Figure 7H:
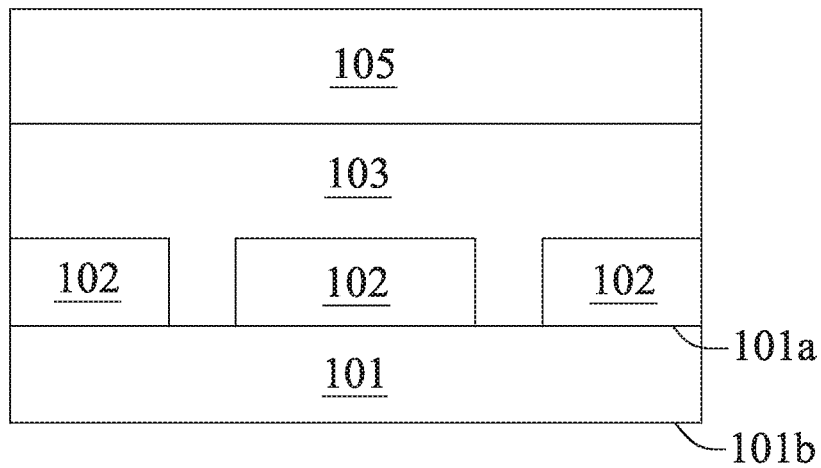

In operation 408, a second photoresist 105 is disposed over the second mask layer 103 as shown in FIG. 7H. The second photoresist 105 is coated on the second mask layer 103. The second photoresist 105 is a light sensitive material with chemical properties depending on an exposure of an electromagnetic radiation. In some embodiments, the second photoresist 105 is sensitive to an electromagnetic radiation such as an ultra violet (UV), that the chemical properties of the second photoresist 105 are changed upon exposure to the electromagnetic radiation. In some embodiments, the second photoresist 105 is disposed over the second mask layer 103 by spin coating or any other suitable operations.

Figure 7I:
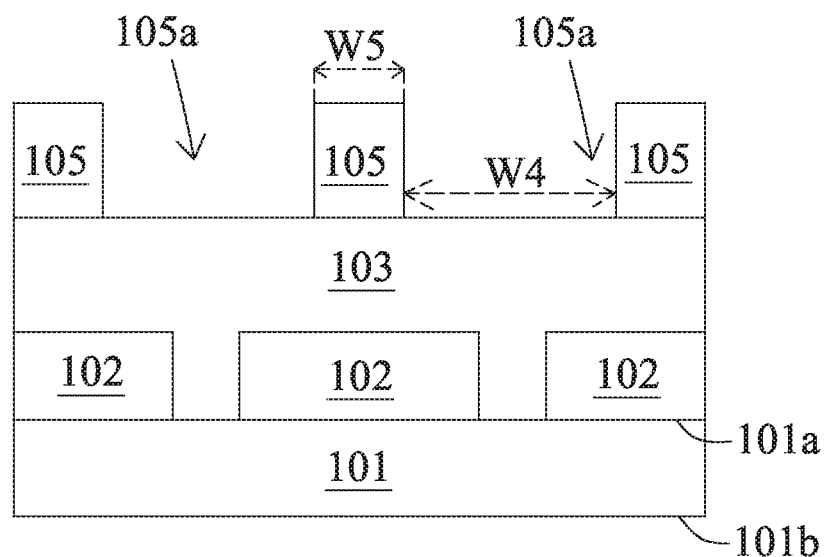

In operation 409, the second photoresist 105 is patterned to form several second openings 105a as shown in FIG. 7I. The second photoresist 105 is patterned by removing portions of the second photoresist 105. In some embodiments, some portions of the second photoresist 105 are exposed to the electromagnetic radiation, and those exposed portions are dissolvable by a developer solution while those unexposed portions are not dissolvable by the developer solution. In some embodiments, the second photoresist 105 is patterned after removal of the exposed portions of the second photoresist 105. The second openings 105a are formed after removal of the exposed portions of the second photoresist 105. Some portions of the second mask layer 103 are exposed from the second photoresist 105 by the second openings 105a. In some embodiments, the second opening 105a of the second photoresist 105 is substantially greater than the first opening 104a of the first photoresist 104.

At least a portion of the second photoresist 105 is disposed between two of the second openings 105a after the patterning of the second photoresist 105. In some embodiments, a width W4 of one of the second openings 105a is about 5 mm to about 15 mm. In some embodiments, the width W4 is about 8 mm to about 10 mm. In some embodiments, a width W5 of a portion of the second photoresist 105 disposed between two of the second openings 105a is about 50 um to about 70 um. In some embodiments, the width W5 is about 60 um. In some embodiments, a ratio of the width W5 of the second photoresist 105 disposed between two of the second openings 105a to the width W4 of one of the second openings 105a is substantially greater than or equal to 0.001.

Figure 7J:
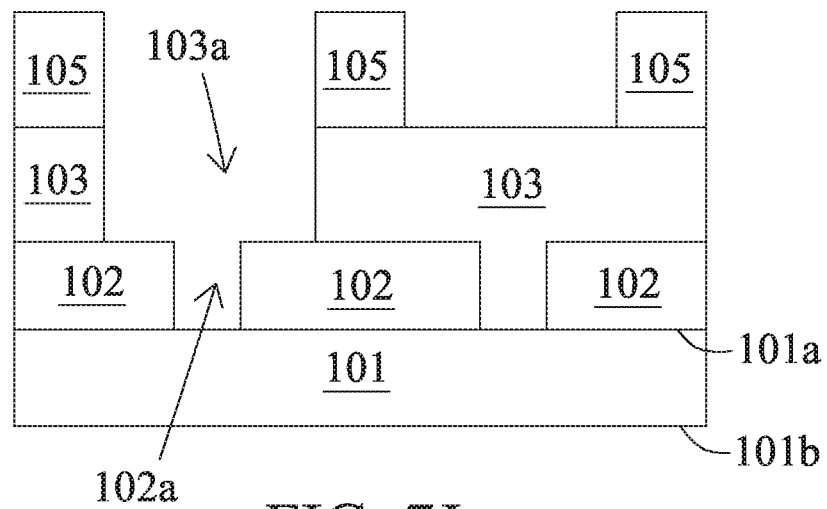
Figure 7K:
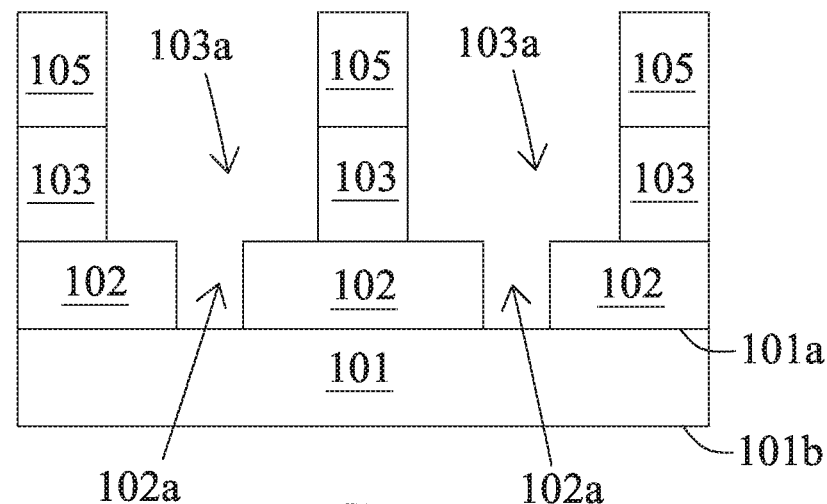

In operation 410, the portions of the second mask layer 103 exposed from the second photoresist 105 are removed to for several second recesses 103a as shown in FIGS. 7J and 7K. The second openings 105a correspond to the second recesses 103a respectively. The second mask layer 103 is defined with several regions 110. Each region 110 includes at least one of the first recesses 102a. In some embodiments, the second mask layer 103 is a boundary layer. In some embodiments, the second recesses 103a are formed one by one. For example, the left portion of the second mask layer 103 is removed first to form one of the second recesses 103a as shown in FIG. 7J, and then the right portion of the second mask layer is removed to form another one of the second recesses 103a as shown in FIG. 7K. In some embodiments, the second recesses 103a are extended through the second mask layer 103. In some embodiments, the portions of the second mask layer 103 exposed from the second photoresist 105 are removed by suitable etching operation such as wet etching, plasma etching, an anisotropic dry etching, a reactive ion etching (RIE), a dry etching or etc.

Figure 7L:
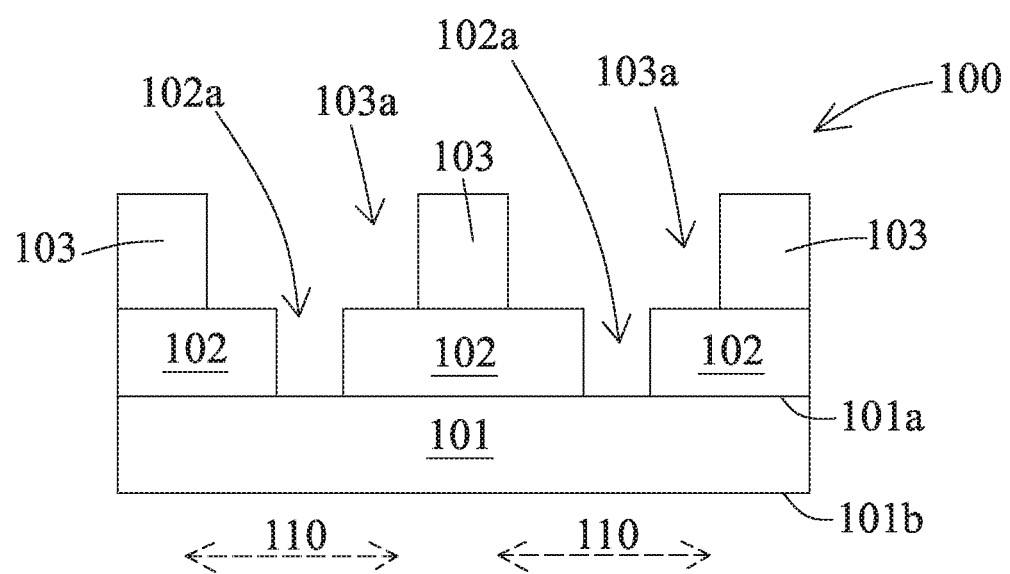

In operation 411, the second photoresist 105 is removed as shown in FIG. 7L. In some embodiment, the second photoresist 105 is removed by suitable photoresist stripping technique, such as chemical solvent cleaning, plasma ashing, dry stripping and/or the like. Several regions 110 In some embodiments, a semiconductor structure 100, 200 or 300 as shown in FIGS. 1-6 is formed. In some embodiment, the semiconductor structure 100, 200 or 300 is a multi-layer mask (MLM) configured for photolithography operations.

Figure 8:
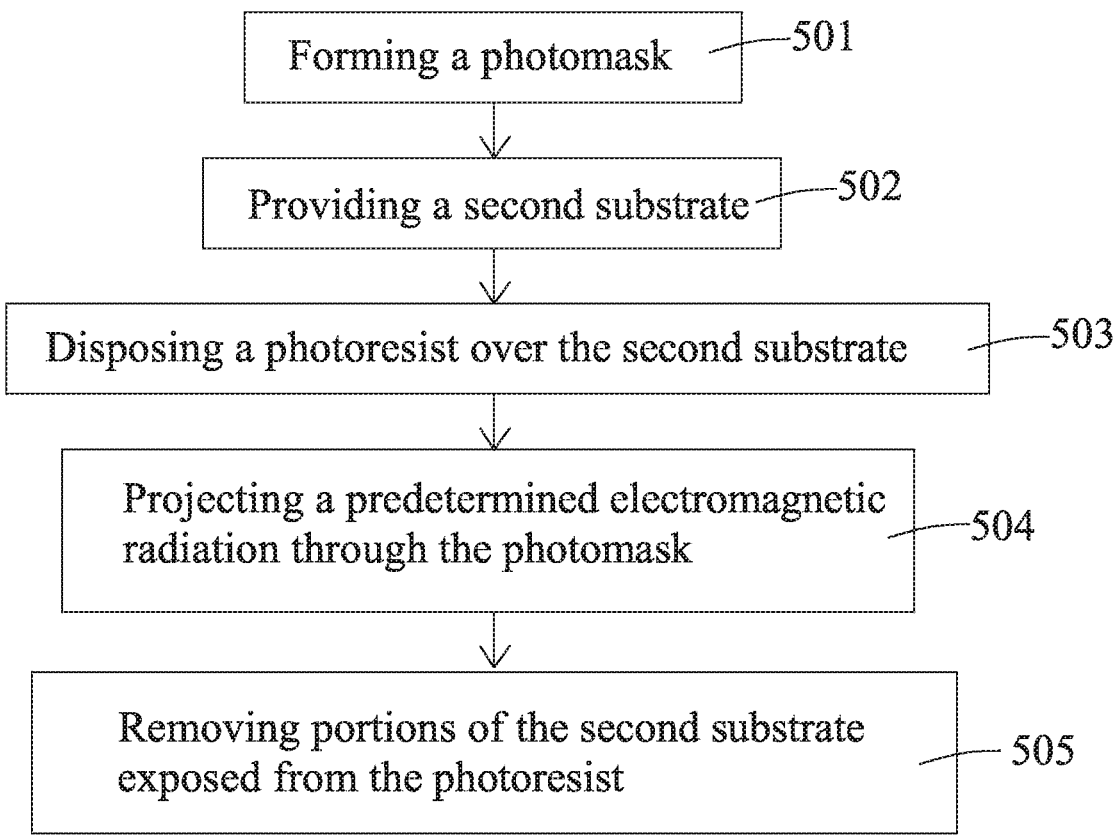
FIG. 8 is a flow diagram of a method of manufacturing a semiconductor structure in accordance with some embodiments of the present disclosure.

In the present disclosure, a method of manufacturing a semiconductor structure is also disclosed. In some embodiments, a semiconductor structure is formed by a method 500. The method 500 includes a number of operations and the description and illustration are not deemed as a limitation as the sequence of the operations. FIG. 8 is an embodiment of the method 500 of manufacturing the semiconductor structure. The method 500 includes a number of operations (501, 502, 503, 504 and 505).

Figure 8A:
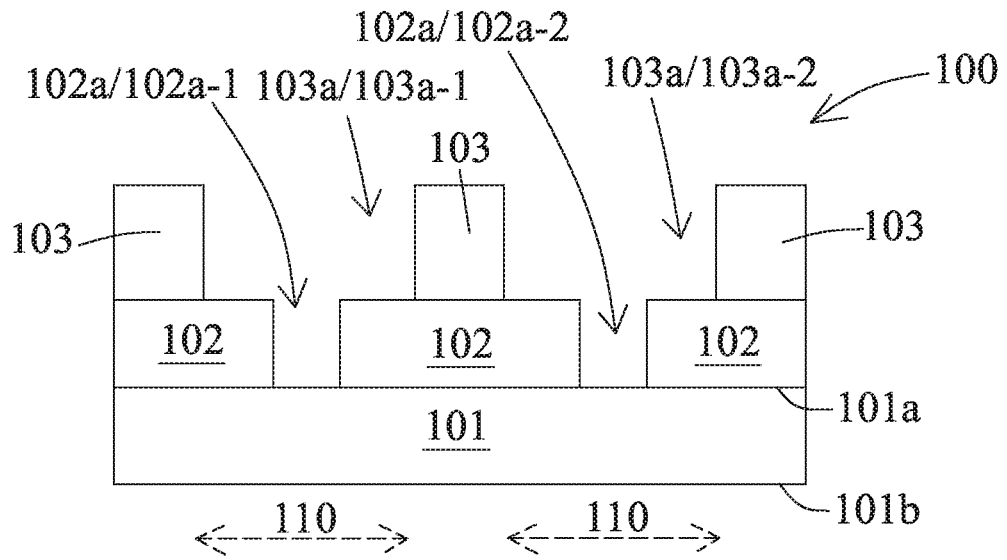
FIGS. 8A-8J are schematic views of manufacturing a semiconductor structure by a method of FIG. 8 in accordance with some embodiments of the present disclosure.

In operation 501, a photomask 100 is formed or provided as shown in FIG. 8A. In some embodiments, the photomask 100 is formed by the method 400 described above. The photomask 100 includes a first substrate 101, a first mask layer 102 and a second mask layer 103. The photomask 100 is defined with several regions 110. The first mask layer 102 includes several first recesses 102a, and the second mask layer 103 includes several second recesses 103a. In some embodiments, the first recesses 102a-1 and 102a-2 are different circuit features. In some embodiments, the first recesses 102a-1 and 102a-2 can be projected over a semiconductive substrate or wafer by a predetermined electromagnetic radiation. The first recesses 102a-1 and 102a-2 are configured to form circuit features over different layers of a semiconductive substrate or wafer. At least a portion of the second mask layer 103 is disposed between two of the second recesses 103s. In some embodiments, the photomask 100 has similar configurations as the semiconductor structure 100, 200 or 300 described above and shown in FIGS. 1-6.

Figure 8B:
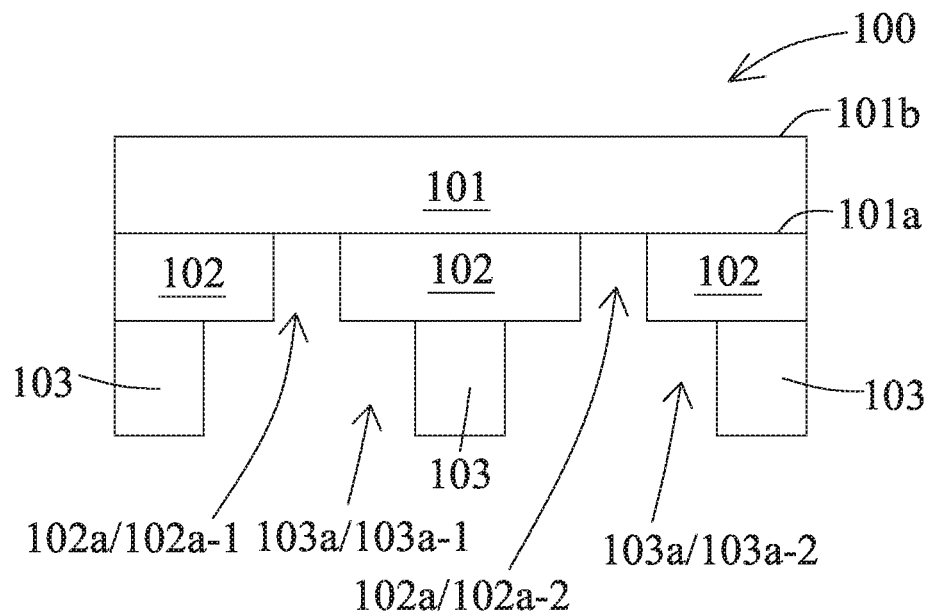

In operation 502, a second substrate 106 is provided or received as shown in FIG. 8B. The second substrate 106 includes semiconductive materials such as silicon or other suitable materials. The second substrate 106 is a wafer. In some embodiments, the second substrate 106 is a silicon substrate or silicon wafer. In some embodiments, the second substrate 106 includes glass or ceramic. In some embodiments, the second substrate 106 is a glass substrate.

Figure 8C:
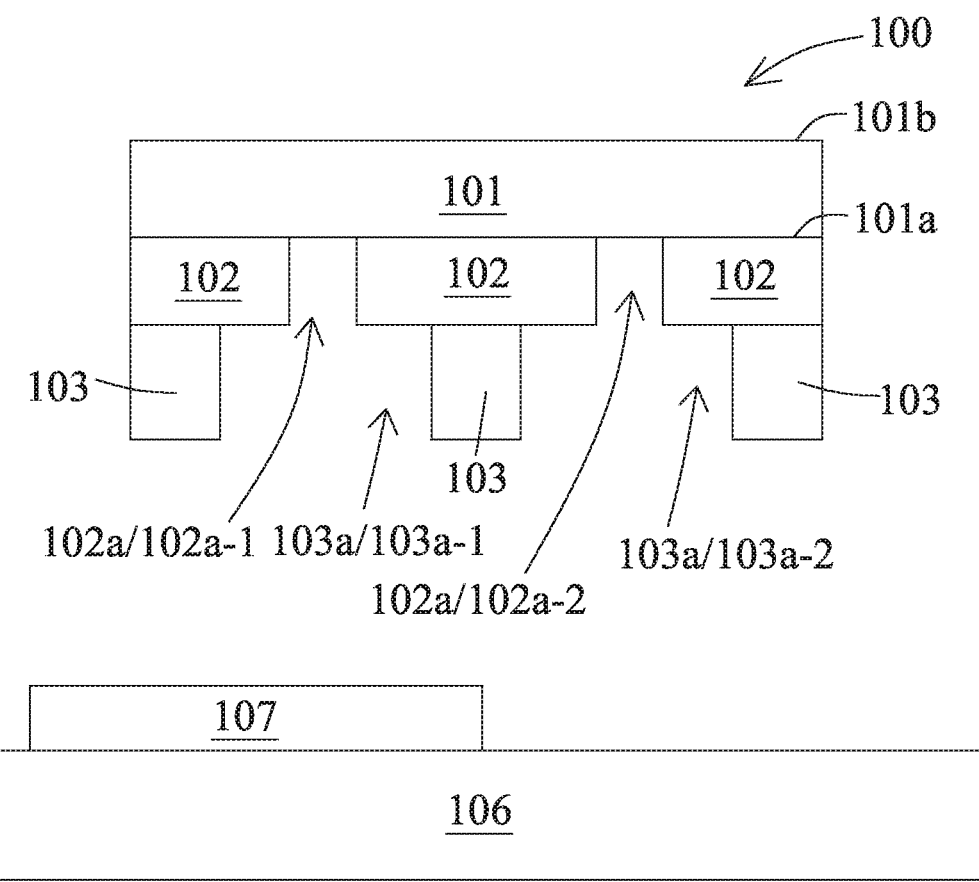

In operation 503, a third photoresist 107 is disposed over the second substrate 106 as shown in FIG. 8C. The third photoresist 107 is a light sensitive material with chemical properties depending on an exposure of an electromagnetic radiation. In some embodiments, the third photoresist 107 is sensitive to an electromagnetic radiation such as an ultra violet (UV), that the chemical properties of the third photoresist 107 are changed upon exposure to the electromagnetic radiation. In some embodiments, the third photoresist 107 is disposed over the second substrate 106 by spin coating or any other suitable operations.

Figure 8D:
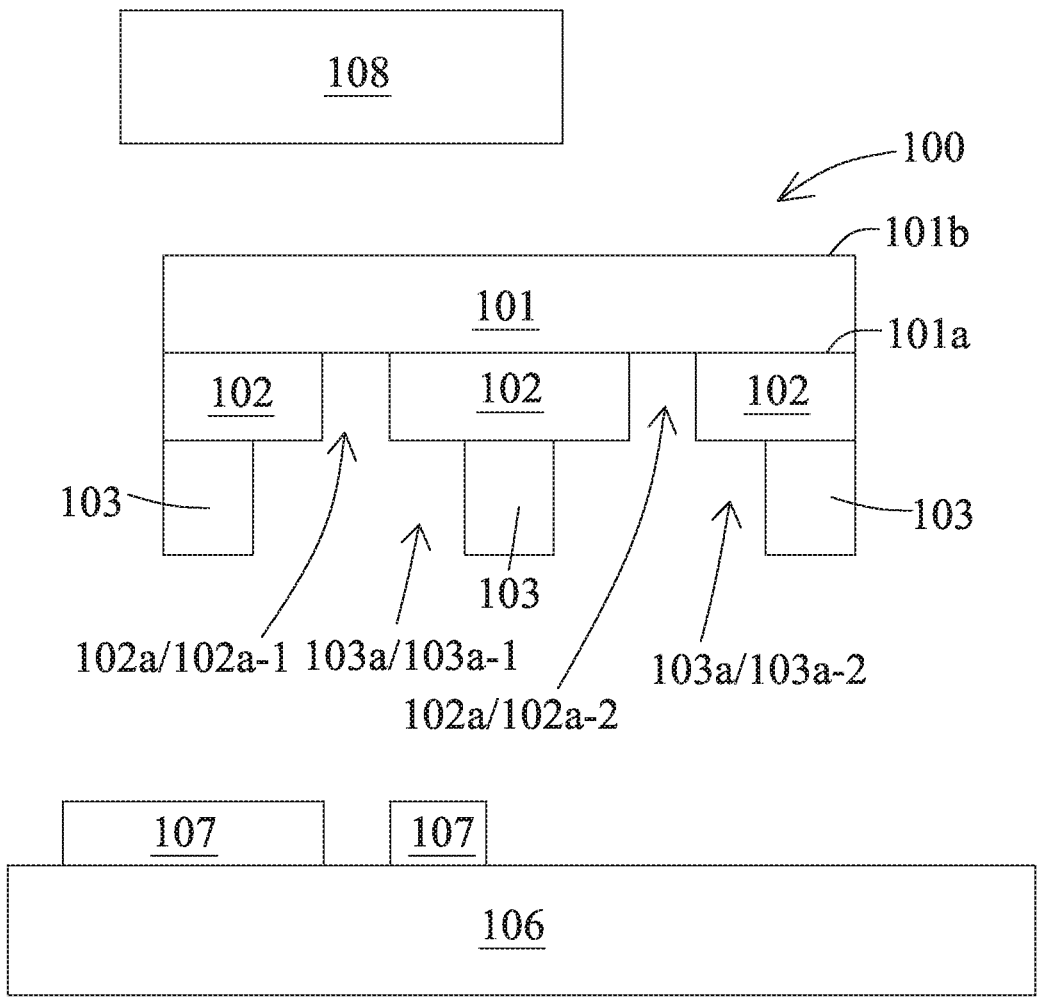

In operation 504, a predetermined electromagnetic radiation is projected through the photomask 100 towards the third photoresist 107 to pattern the third photoresist 107 as shown in FIG. 8D. The second recess 103a-1 of the second mask layer 103 is aligned with a predetermined position of the third photoresist 107. The predetermined electromagnetic radiation is irradiated from a source 108. In some embodiments, the predetermined electromagnetic radiation is ultraviolet (UV), laser, visible light, x-ray, extreme ultraviolet (EUV), deep ultraviolet (DUV), ions beam, electrons beam, etc. In some embodiments, the first mask layer 102 is at least partially transparent to the predetermined electromagnetic radiation, the second mask layer 103 is opaque to the predetermined electromagnetic radiation.

The predetermined electromagnetic radiation can pass through the first substrate 101 and the first recesses 102a to the third photoresist 107, such that an image of the first recesses 102a can be projected over the third photoresist 107 to pattern the third photoresist 107. A phase of the predetermined electromagnetic radiation passing through the first mask layer 102 is shifted 180° with respect to a phase of the predetermined electromagnetic radiation passing through the first substrate 101 upon the projection of the predetermined electromagnetic radiation, such that a quality of the image of the first recesses 102a projected over the third photoresist 107 is increased or improved.

In some embodiments, the photomask 100 or the first recess 102a-1 is aligned with the third photoresist 107 or the second substrate 106, such that the image of the first recess 102a-1 can be projected over a predetermined position of the third photoresist 107. The third photoresist 107 is patterned by removing portions of the third photoresist 107. In some embodiments, some portions of the third photoresist 107 are exposed to the predetermined electromagnetic radiation, and those exposed portions are dissolvable by a developer solution while those unexposed portions are not dissolvable by the developer solution. The third photoresist 107 is patterned after removal of the exposed portions of the third photoresist 107.

Figure 8E:
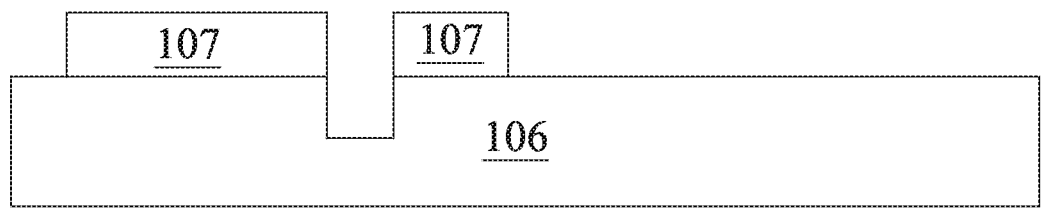
Figure 8F:
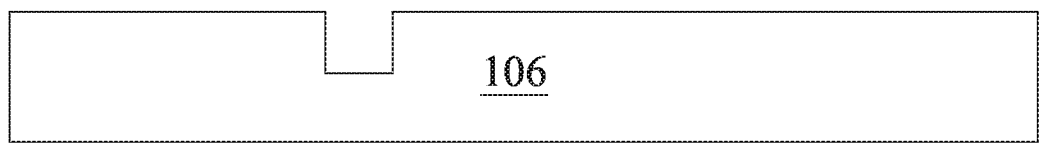

In operation 505, portions of the second substrate 106 exposed from the third photoresist 107 are removed as shown in FIG. 8E. The portions of the second substrate 106 exposed from the third photoresist 107 correspond to the first recesses 102a respectively. In some embodiments, the portion of the second substrate 106 corresponding to the first recess 102a-1 is removed, such that a circuit feature corresponding to the first recess 102a-1 is formed over a first layer of the second substrate 106. In some embodiments, the third photoresist 107 is removed as shown in FIG. 8F after the formation of the first recess 102a-1 over the second substrate 106.

Figure 8G:
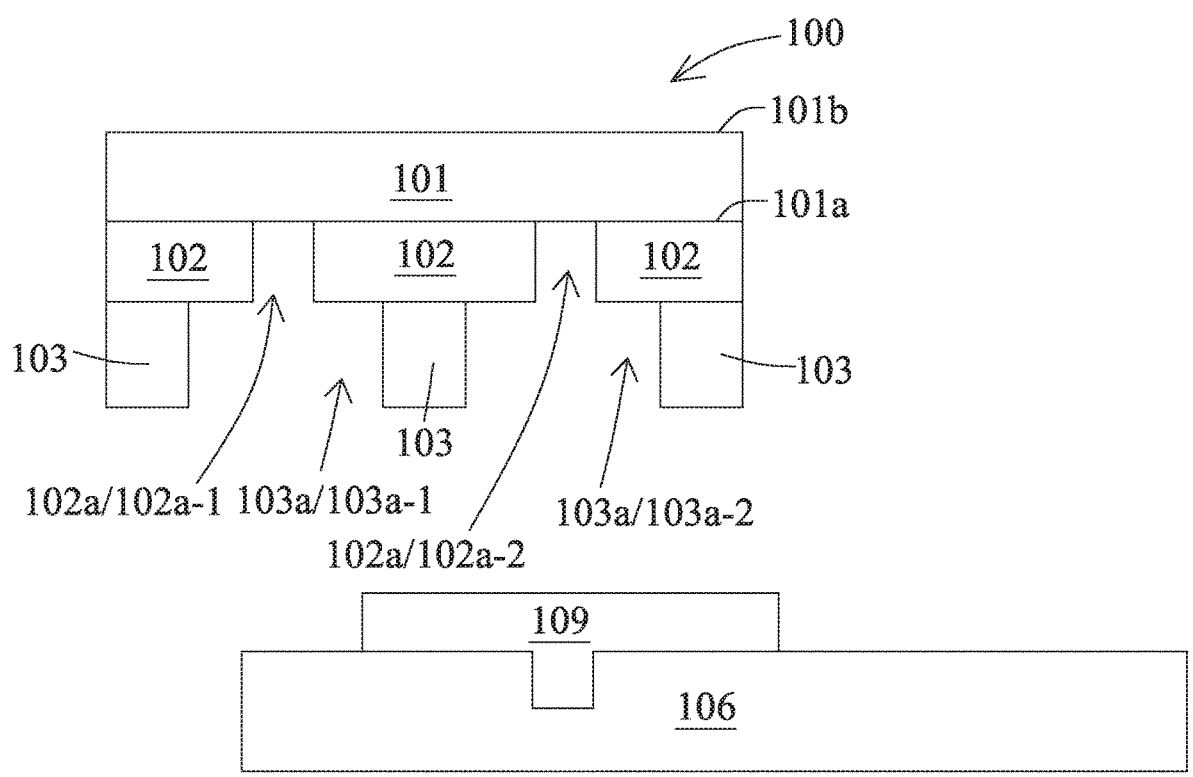

In some embodiments, after the formation of the first recess 102a-1 over the first layer of the second substrate 106, the first recess 102a-2 is formed over a second layer of the second substrate 106 as shown in FIGS. 8G-8J. In some embodiments, a fourth photoresist 109 is disposed over the second substrate 106 as shown in FIG. 8G. In some embodiments, the fourth photoresist 109 has similar configurations as the third photoresist 107.

Figure 8H:
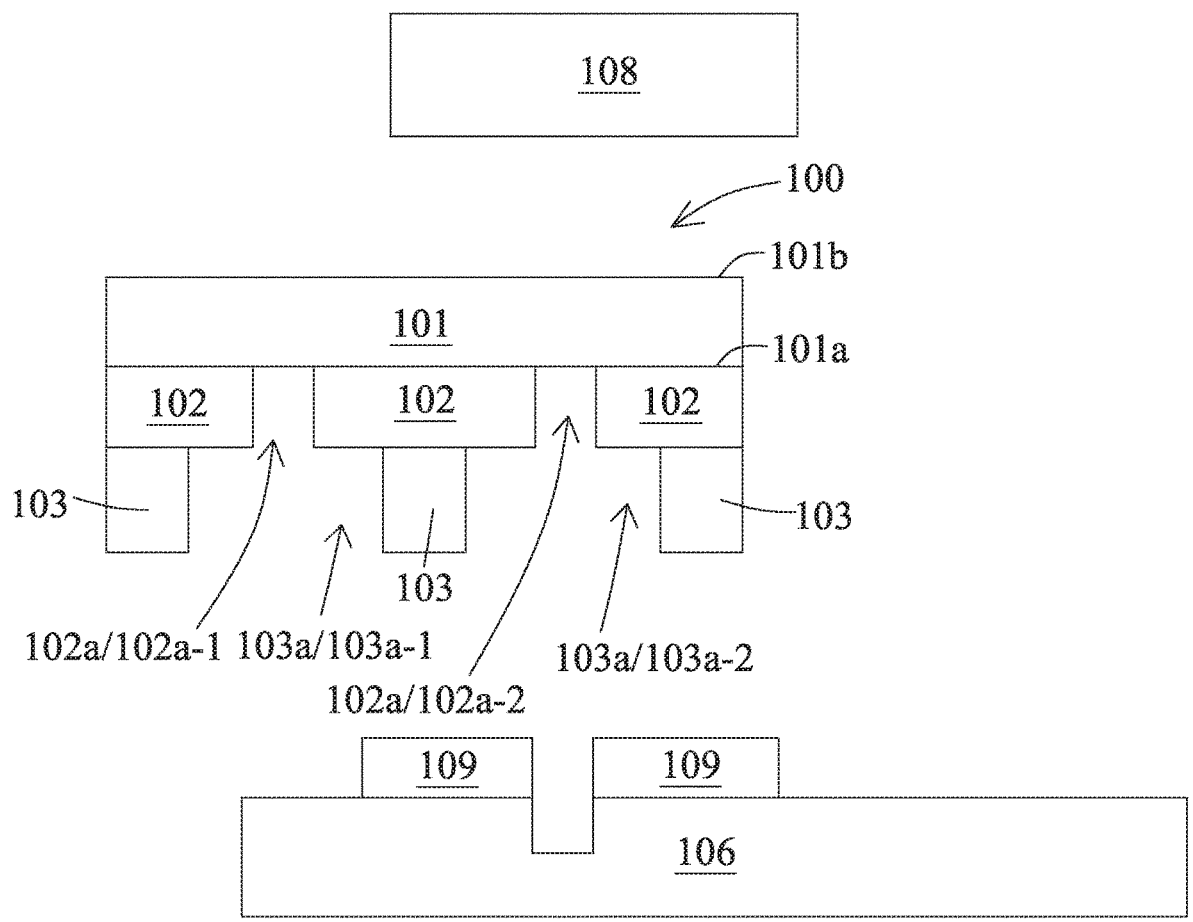

In some embodiments, after the formation of the first recess 102a-1 over the first layer of the second substrate 106, the photomask 100 is moved to project an image of the first recess 102a-2 over the fourth photoresist 109 to form a circuit feature corresponding to the first recess 102a-2 over a second layer of the second substrate 106 as shown in FIG. 8H. In some embodiments, the photomask 100 is moved such that the second recess 103a-2 of the second mask layer 103 is aligned with a predetermined position of the second substrate 106. In some embodiments, the second recesses 103a-1 and 103a-2 are heated by the predetermined electromagnetic radiation upon projection of the predetermined electromagnetic radiation through the photomask 100. In some embodiments, heat expansion of the second recesses 103a-1 is substantially the same as heat expansion of the second recess 103a-2, since the second mask layer 103 surrounds both of the second recesses 103a-1 and 103a-2. In some embodiments, a position of the second recess 103a-1 as shown in FIG. 8D is vertically aligned with a position of the second recess 103a-2 as shown in FIG. 8H. In some embodiments, the source 108 irradiates the predetermined electromagnetic radiation through the second recess 103a-2 towards the fourth photoresist 109 to project the first recess 102a-2 over the fourth photoresist 109. In some embodiments, the fourth photoresist 109 is patterned by removing a portion of the fourth photoresist 109 exposed to the predetermined electromagnetic radiation.

Figure 8I:
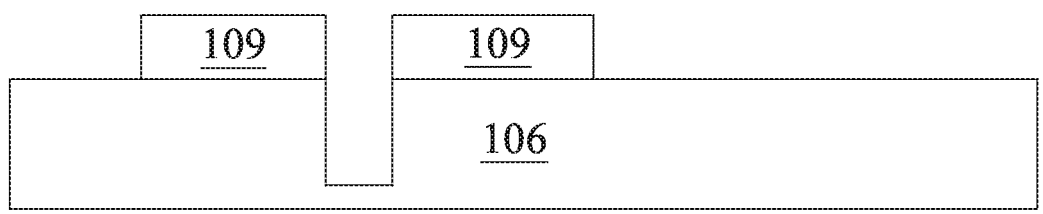
Figure 8J:
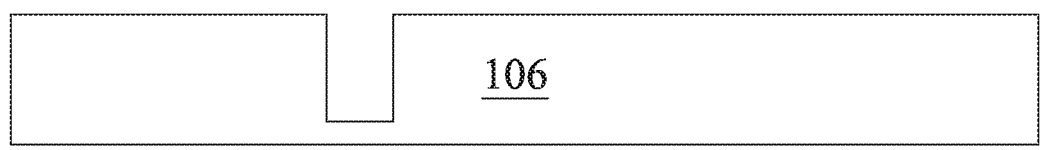

In some embodiments, a portion of the second substrate 106 exposed from the fourth photoresist 109 is removed as shown in FIG. 8I. In some embodiments, the first recess 102a-2 is formed over the second layer of the second substrate 106. In some embodiments, the fourth photoresist 109 is removed after the formation of the first recess 102a-2.

In the present disclosure, a semiconductor structure is disclosed. The semiconductor structure includes a substrate, a first mask layer disposed over the substrate and including a plurality of first recesses extended through the first mask layer, and a second mask layer disposed over the first mask layer and including a plurality of second recesses extended through the second mask layer. At least a portion of the second mask layer is disposed between two of the plurality of second recesses. As such, each region defined over the semiconductor structure is surrounded by the second mask layer, and thermal stress around each region upon photolithography operations is substantially consistent. Therefore, alignment between regions of the semiconductor structure is improved, and quality of formation of circuit feature over a semiconductive substrate or wafer by the semiconductor structure is also improved.

In some embodiments, a method of manufacturing a semiconductor structure includes providing a mask including a first substrate; a first mask layer disposed over the first substrate, including a plurality of first recesses extended through the first mask layer; a second mask layer disposed over the first mask layer and including a plurality of second recesses extended through the second mask layer; providing a second substrate including a photoresist disposed over the second substrate; and projecting a predetermined electromagnetic radiation through the mask towards the photoresist, wherein the first mask layer is at least partially transparent to the predetermined electromagnetic radiation, the second mask layer is opaque to the predetermined electromagnetic radiation, and at least a portion of the second mask layer is disposed between two of the plurality of second recesses.

In some embodiments, at least a portion of the first mask layer is disposed between two of the plurality of first recesses, and the portion of the second mask layer is disposed over the portion of the first mask layer. In some embodiments, a ratio of a width of the portion of the second mask layer to a width of one of the plurality of second recesses is substantially greater than or equal to 0.001. In some embodiments, a width of one of the plurality of second recesses is substantially greater than a width of one of the plurality of first recesses. In some embodiments, a width of one of the plurality of second recesses is about 5 mm to about 15 mm. In some embodiments, a width of the portion of the second mask layer disposed between two of the plurality of second recesses is about 50 um to about 70 um.

In some embodiments, the first mask layer includes molybdenum silicon (MoSi). In some embodiments, the second mask layer includes chromium (Cr). In some embodiments, the substrate is transparent to the predetermined electromagnetic radiation. In some embodiments, the substrate includes quartz. In some embodiments, about 5% to about 20% of the predetermined electromagnetic radiation is penetrable to the first mask layer. In some embodiments, the predetermined electromagnetic radiation is an ultraviolet (UV) or laser.

In some embodiments, a method of manufacturing a semiconductor structure includes providing a substrate; disposing a first mask layer over the substrate; disposing a first photoresist over the first mask layer; patterning the first photoresist to form a plurality of first openings; removing portions of the first mask layer exposed from the first photoresist to form a plurality of first recesses extended through the first mask layer; removing the first photoresist; disposing a second mask layer over the first mask layer; disposing a second photoresist over the second mask layer; patterning the second photoresist to form a plurality of second openings; removing portions of the second mask layer exposed from the second photoresist to form a plurality of regions over the substrate; and removing the second photoresist, wherein each of the plurality of regions includes at least one of the plurality of first recesses, the first mask layer is at least partially transparent to a predetermined electromagnetic radiation, the second mask layer is opaque to the predetermined electromagnetic radiation, and at least a portion of the second photoresist is disposed between two of the plurality of second openings after the patterning of the second photoresist.

In some embodiments, the patterning of the first photoresist includes removing portions of the first photoresist, or the patterning of the second photoresist includes removing portions of the second photoresist. In some embodiments, a width of one of the plurality of second openings is about 5 mm to about 15 mm. In some embodiments, a ratio of a width of a portion of the second photoresist disposed between two of the plurality of second openings to a width of one of the plurality of second openings is substantially greater than or equal to 0.001. In some embodiments, one of the plurality of second openings is substantially greater than one of the plurality of first openings.

In some embodiments, a method of manufacturing a semiconductor structure includes forming a photomask including providing a first substrate; forming a first mask layer over the first substrate, wherein the first mask layer includes a plurality of first recesses extended through the first layer; forming a second mask layer over the first mask layer, wherein the second mask layer includes a plurality of regions over the first substrate; providing a second substrate; disposing a photoresist over the second substrate; projecting a predetermined electromagnetic radiation through the photomask towards the photoresist to pattern the photoresist; and removing portions of the second substrate exposed from the photoresist, wherein each of the plurality of regions includes at least one of the plurality of first recesses, the first mask layer is at least partially transparent to the predetermined electromagnetic radiation, the second mask layer is opaque to the predetermined electromagnetic radiation, and at least a portion of the second mask layer is disposed between two of the plurality of regions.

In some embodiments, a phase of the predetermined electromagnetic radiation passing through the first mask layer is shifted 180° with respect to a phase of the predetermined electromagnetic radiation passing through the first substrate upon the projection of the predetermined electromagnetic radiation. In some embodiments, the portions of the second substrate exposed from the photoresist correspond to the plurality of first recesses respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of manufacturing a semiconductor structure, comprising:
    providing a mask including:
        a first substrate;
        a first mask layer disposed over the first substrate, including a plurality of first recesses extended through the first mask layer;
        a second mask layer disposed over the first mask layer and including a plurality of second recesses extended through the second mask layer;
    providing a second substrate including a photoresist disposed over the second substrate; and
    projecting a predetermined electromagnetic radiation through the mask towards the photoresist,
wherein the first mask layer is at least partially transparent to the predetermined electromagnetic radiation, the second mask layer is opaque to the predetermined electromagnetic radiation, and at least a portion of the second mask layer is disposed between two of the plurality of second recesses, wherein an edge of the second mask layer is flush with an edge of the first substrate.

2. The method of claim 1, wherein at least a portion of the first mask layer is disposed between two of the plurality of first recesses, and the portion of the second mask layer is disposed over the portion of the first mask layer.

3. The method of claim 1, wherein a ratio of a width of the portion of the second mask layer to a width of one of the plurality of second recesses is substantially greater than or equal to 0.001.

4. The method of claim 1, wherein a width of one of the plurality of second recesses is substantially greater than a width of one of the plurality of first recesses.

5. The method of claim 1, wherein a width of one of the plurality of second recesses is about 5 mm to about 15 mm.

6. The method of claim 1, wherein a width of the portion of the second mask layer disposed between two of the plurality of second recesses is about 50 um to about 70 um.

7. The method of claim 1, wherein the first mask layer includes molybdenum silicon (MoSi).

8. The method of claim 1, wherein the second mask layer includes chromium (Cr).

9. The method of claim 1, wherein the first substrate is transparent to the predetermined electromagnetic radiation.

10. The method of claim 1, wherein the first substrate includes quartz.

11. The method of claim 1, wherein about 5% to about 20% of the predetermined electromagnetic radiation is penetrable to the first mask layer.

12. The method of claim 1, wherein the predetermined electromagnetic radiation is an ultraviolet (UV) or laser.

13. A method of manufacturing a semiconductor structure, comprising:
    forming a photomask including:
        providing a first substrate;
        forming a first mask layer over the first substrate, wherein the first mask layer includes a plurality of first recesses extended through the first layer;
        forming a second mask layer over the first mask layer, wherein the second mask layer includes a plurality of regions over the first substrate;
    providing a second substrate;
    disposing a photoresist over the second substrate;
    projecting a predetermined electromagnetic radiation through the photomask towards the photoresist to pattern the photoresist; and
    removing portions of the second substrate exposed from the photoresist,
wherein each of the plurality of regions includes at least one of the plurality of first recesses, the first mask layer is at least partially transparent to the predetermined electromagnetic radiation, the second mask layer is opaque to the predetermined electromagnetic radiation, and at least a portion of the second mask layer is disposed between two of the plurality of regions, wherein an edge of the second mask layer is flush with an edge of the first substrate.

14. The method of claim 13, wherein a phase of the predetermined electromagnetic radiation passing through the first mask layer is shifted 180° with respect to a phase of the predetermined electromagnetic radiation passing through the first substrate upon the projection of the predetermined electromagnetic radiation.

15. The method of claim 13, wherein the portions of the second substrate exposed from the photoresist correspond to the plurality of first recesses respectively.

* * * * *